United States Patent [19]
Pfiester

[11] Patent Number: 4,761,385
[45] Date of Patent: Aug. 2, 1988

[54] FORMING A TRENCH CAPACITOR

[75] Inventor: James R. Pfiester, Austin, Tex.

[73] Assignee: Motorola, Inc., Schaumburg, Ill.

[21] Appl. No.: 13,096

[22] Filed: Feb. 10, 1987

[51] Int. Cl.$^4$ .............................................. H01L 29/93
[52] U.S. Cl. ...................................... 437/52; 437/60; 437/156; 29/25.42; 357/23.6
[58] Field of Search ............................ 437/52, 60, 156; 357/23.6; 29/25.42

[56] References Cited

U.S. PATENT DOCUMENTS

H204  2/1987  Oh et al. ............................. 156/648

FOREIGN PATENT DOCUMENTS

| 0149799 | 7/1985 | European Pat. Off. | ............ 357/23.6 |
| 60-64444 | 4/1985 | Japan . | |
| 0140860 | 7/1985 | Japan | ................. 357/23.6 |
| 0154664 | 8/1985 | Japan | ................. 357/23.6 |

OTHER PUBLICATIONS

R. B. Fair, "Impurity Diffusion and Oxidation of Silicon," *Silicon Integrated Circuits*, Part B, Raymond Wolfe, ed., Academic Press, 1981, pp. 91–108.

M. Sakamoto, et al., "Buried Storage Electrode (BSE) Cell for Megabit DRAMS," *IEDM* 1985 *Digest*, Dec. 1985, pp. 710–713.

*Primary Examiner*—Olik Chaudhuri
*Attorney, Agent, or Firm*—John A. Fisher; Jeffrey Van Myers; David L. Mossman

[57] ABSTRACT

A trench capacitor having increased capacitance. By means of the oxidation enhanced diffusion (OED) effect, locally outdiffused regions in the doped substrate of a semiconductor material may be formed. Thus, greater capacitance can be achieved for a trench capacitor of equal depth. This technique avoids the heretofore required extra doping in the well of opposite conductivity type that would have been necessary to prevent punchthrough if the entire lower, heavily doped region or substrate had to be formed closer to the surface of the overlying lightly doped semiconductor layer. The locally outdiffused regions may be accomplished by standard oxidation techniques.

4 Claims, 3 Drawing Sheets

FORMING A TRENCH CAPACITOR

Field of the Invention

The invention generally relates to integrated circuit devices, and more specifically relates to trench capacitors relying on substrate dopant concentration for capacitance.

BACKGROUND OF THE INVENTION

It is well known that in the art of integrated circuit manufacture one of the primary goals is increasing the number of devices that can be placed into a given space on the semiconductor chip. As the traditional fabrication processes begin to approach their limits of reduction, process and device designers have increasingly turned their attention toward orienting the device elements vertically in a direction normal to the surface of the semiconductor wafer, rather than in the more traditional orientation of a horizontal or planar direction along the flat water surface. Thus, considerable attention has been applied to forming devices on pillars or mesas above the wafer surface or down into trenches into the wafer to take advantage of the extra versatility of the third dimension.

One of the more successful vertically oriented integrated circuit devices is the trench capacitor. Briefly, a trench capacitor is formed by forming a trench into the semiconductor substrate, lining the substrate with a thin dielectric layer and plugging the remainder of the trench with a semiconductor material. The semiconductor substrate and the semiconductor material plug are both doped with impurities to make them conductive allowing them to form the plates of the capacitor across the thin dielectric.

One such trench capacitor is used in the buried storage electrode (BSE) cell devised by M. Sakamoto, et al., "Buried Storage Electrode (BSE) Cell for Megabit DRAMs," *IEDM 1985 Digest*, December, 1985, p. 710–713, and illustrated in FIG. 2. The BSE cell 10 is a dynamic random access memory (DRAM) cell having one-transistor 12 with the memory word line 14 as the gate of the transistor, the memory bit line 16 as the one of the source/drain regions where the other source/drain region 18 of the transistor 12 is tied to one plate 20 of the capacitor. The capacitor 22 is formed in a trench 24 which pierces the p$^-$ epi layer 26 to intersect and penetrate the p$^+$ substrate 28. Capacitor 22 comprises two plates, the central conductive material plate 20 and the plate formed by p$^+$ substrate 28 separated by thin dielectric film 30. Due to depletion layer spreading in the p$^-$ epi layer 26, most of the effective capacitance of the BSE cell 10 is in the p$^+$ substrate 28. Because of its inherent punchthrough-free nature and high immunity against alpha-particle soft errors, the BSE cell 10 is suitable for high density integration.

The limitations on the trench capacitor, such as the trench capacitor 22 of BSE cell 10, are mainly due to the ability to etch and fill the trench 24. Trenches may typically have 6–7 micron (um) depths with approximately 1.5 μm openings. Thus, one approach to increase the capacitance of capacitor 22 would be to form the trench 24 deeper to contact the p$^+$ substrate.

The p$^-$ epi layer 26 also has a minimum limitation on thickness due to the outdiffusion of boron from the heavily doped p$^+$ substrate 28. If the p$^+$ substrate 28 is too close to the bottom of the n-well layer 29, or in other words, if the epi p$^-$ layer 26 is too thin, then the n-well 29 doping must be undesirably high to avoid punchthrough of the p$^+$ source/drain region 31 junctionto-well depletion layer with the well-to-substrate depletion layer. Stated another way, the undesirable punchthrough effect or shorting of the carrier flow from the source/drain 31 to the substrate 28 would occur. This can be solved by heavy doping of the well 29. However, the extra heavy doping of the wall 29 in turn degrades the body effect of the p-channel metal-oxide-semiconductor transistor (PMOST) and increases the parasitic p$^+$ junction capacitance.

Thus, while the principles behind the BSE cell are sound, the practical aspects of building a device dictate that the capacitor of the cell would not have the desired amount of capacitance, or if the correct capacitance were attained, the extra doping in the well of opposite conductivity required to raise the capacitance would undesirably affect the PMOST devices.

SUMMARY OF THE INVENTION

Accordingly, it is an object of the present invention to provide a DRAM cell with a capacitor having improved capacitance without the need for providing extra doping in the well of opposite conductivity type from the substrate.

Another object of the present invention is to provide a DRAM cell having a capacitor with more capacitance, up to approximately 20% more, than normally attainable from trench capacitors fabricated into epitaxial semiconductor layers.

It is another object of the invention to provide a DRAM cell with increased capacitance and no extra doping in the well layer in which is resides which can be manufactured using conventional processing technology.

Still another object of the present invention is to provide a CMOS memory cell having a wider epi flat zone or an n-well area as compared to a p-well area.

In carrying out these and other objects of the invention, there is provided, in one form, a trench capacitor formed in a doped semiconductor substrate with a doped layer of semiconductor material on the semiconductor substrate and a localized outdiffused region extending from the doped semiconductor substrate into the doped layer of semiconductor material. A trench exists within the doped layer of semiconductor material wherein the trench intersects the localized outdiffused region. A dielectric layer coats the trench, and a layer of conductive material fill the trench, as a plug.

It should be noted that the cross sectional, profile illustrations in FIGS. 1 through 4 are not to scale and that the vertical dimensions of the features shown are exaggerated relative to the horizontal dimensions for clarity.

DETAILED DESCRIPTION OF THE INVENTION

Figure 3:
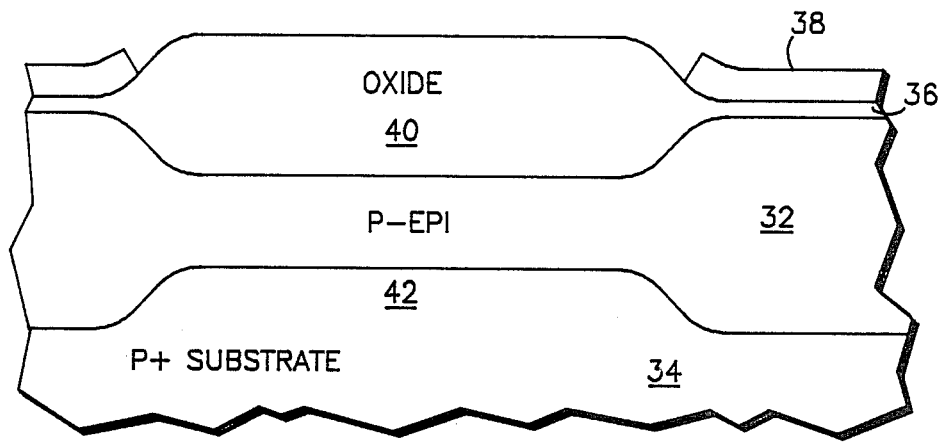
FIG. 3 is a cross sectional, profile view of the capacitor of the instant invention under construction illustrating the localized outdiffused region of the doped semiconductor substrate in the direction of the epitaxial layer.

The invention concerns the provision of a "shallower" p− epi layer only within the p well region. It is anticipated that this phenomenon could be accomplished by a patterned local oxidation of silicon (LOCOS) prior to the well formation as illustrated in FIG. 3. In the construction of the capacitor of this invention, a doped layer of semiconductor material 32 is formed upon a doped semiconductor substrate 34. In the illustration of this discussion, the semiconductor substrate 34 is a p+ doped monocrystalline silicon substrate and the doped semiconductor material layer 32 is a p− epitaxial layer monocrystalline silicon layer grown upon substrate 34. However, it is to be understood that the semiconductor material may be other materials other than silicon or a monocrystalline material, and that the conductivity types of the substrate, epi layer or subsequently formed doped silicon regions may be reversed without affecting the instant invention.

In the well known LOCOS process, a thin layer of oxide 36 is formed on top of the p− epi layer 32, over which is formed a layer of silicon nitride 38. An opening is formed in the two layers 36 and 38 where the p well is to be located and the silicon exposed in the opening is oxidized using any of the well known means, such as steam oxidation, to form field oxidation region 40.

In conventional processing, oxidation region 40 is left to isolate the various devices, e.g. field effect transistors (FETs), etc. However, in this case the oxide was grown to take advantage of the known oxidation enhanced diffusion (OED) effect which, in brief, causes localized increased outdiffusion of the p+ substrate 34 into the p− epi layer 32 to form a localized outdiffused region 42. It has been well established that boron, phosphorus and arsenic experience enhanced diffusivity when silicon is oxidized. The extent of the enhancement for a given impurity depends upon the oxidation temperature and ambient and upon silicon orientation. See, for example, R. B. Fair, "Impurity Diffusion and Oxidation of Silicon," a chapter in D. Kahng, ed., *Silicon Integrated Circuits, Part B*, Academic Press, 1982, especially pages 91–103. The OED phenomenon is described extensively there, and although a localized OED effect is not demonstrated or shown, its possibility is suggested.

Figure 5:
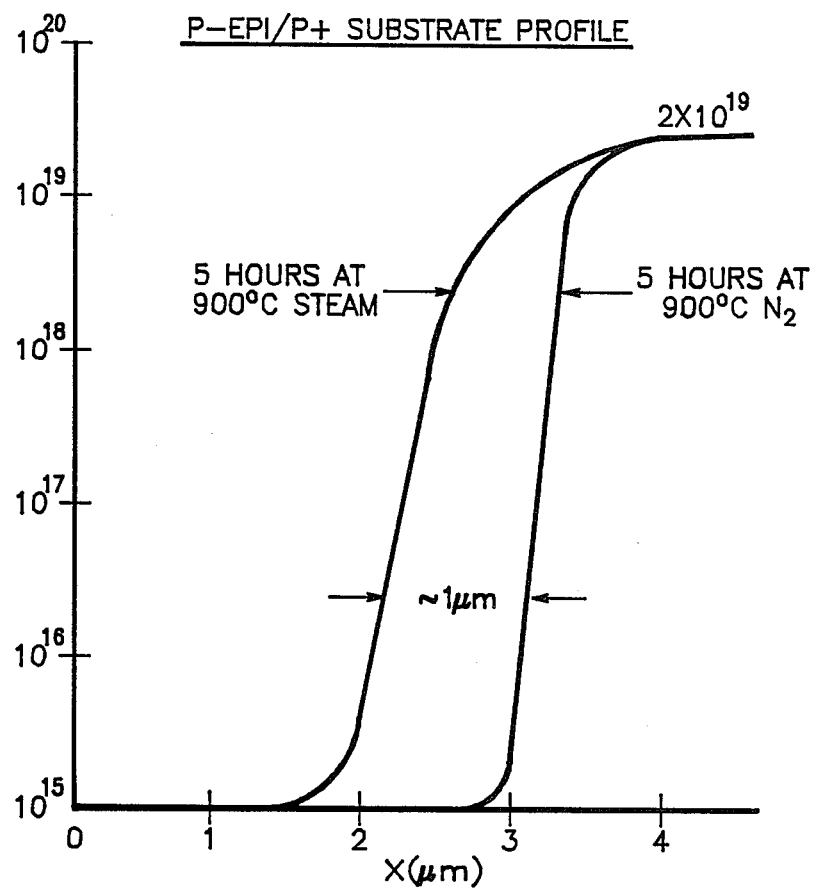
FIG. 5 is a graph showing the results of a SUPREM3 computer simulation demonstrating the expected effect of the outdiffusion of dopants from the doped semiconductor substrate into the doped epitaxial semiconductor layer.

Shown in FIG. 5 is a Suprem3 computer simulation of the OED effect as it might be practiced in fabricating a capacitor of this invention. Note that after the five hour steam oxidation at 900° C. the boron from the p+ substrate can be expected to have migrated approximately one micron into the p− epitaxial layer, or in the direction of the surface of the wafer. It is this extra localized outdiffused region, as in region 42, that enables a capacitor with increased capacitance to be formed without increasing the doping under the other region, particularly under any n-well regions.

Figure 4:
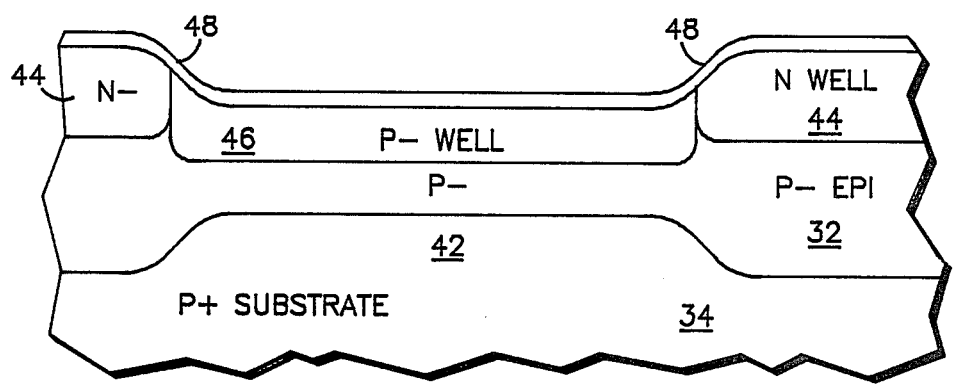
FIG. 4 is a cross sectional, profile view of the capacitor of the instant invention under construction after the formation of the wells just prior to the formation of the trench for the trench capacitor.

Shown in FIG. 4 is a cross sectional profile after some other possible processing steps were performed on the structure of FIG. 3. The masking layer of nitride 38, thin oxide layer 36 and field oxide layer 40 are removed and n-wells 44 and p-well 46 are formed by any of the various known techniques, which may involve photomasking of the appropriate regions and diffusion or implantation of the impurities to make the wells 44 and 46, or other possible processes. Some of these well formation procedures may make use of alignment step 48 for precise registration of the wells.

Figure 1:
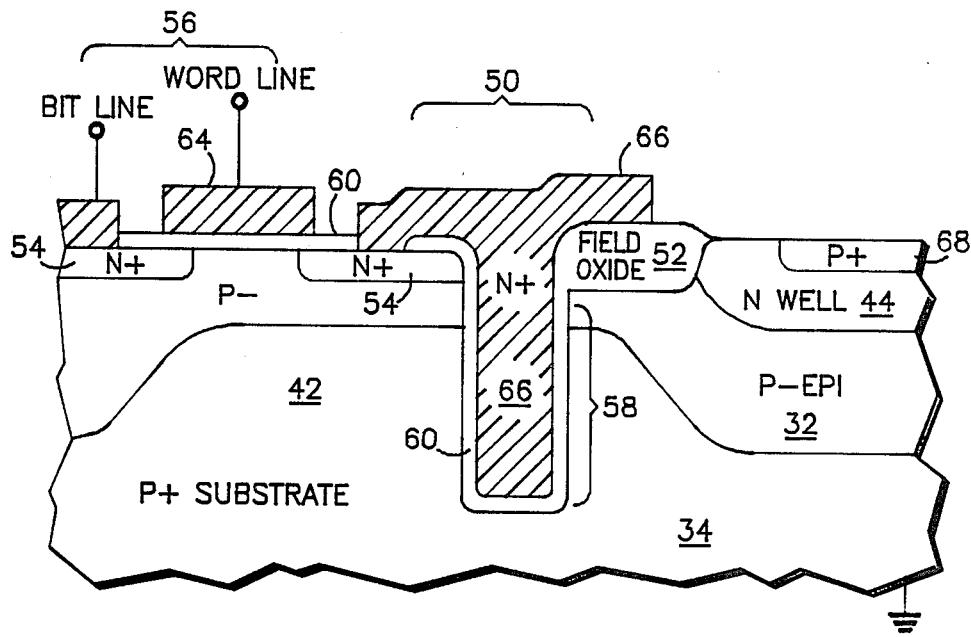
FIG. 1 is a cross sectional, profile view of a DRAM memory cell which employs a trench capacitor of the inventive structure.
Figure 2:
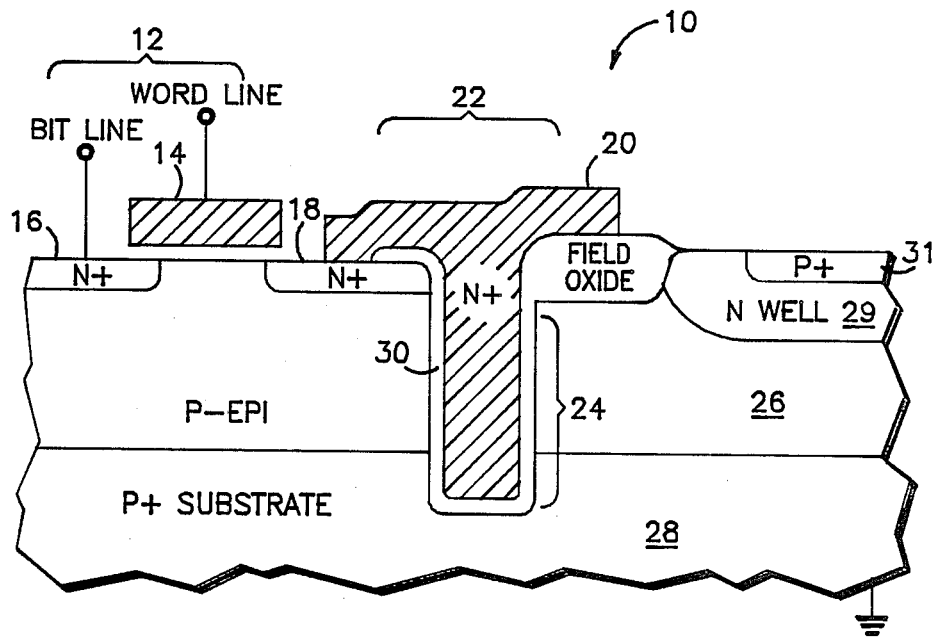
FIG. 2 is a cross sectional, profile view of a prior art DRAM memory cell employing a traditional trench capacitor.

The wafer would now be ready for the formation of the trench capacitor 50 shown completed in FIG. 1. Any of the known methods for forming trench capacitors and adjacent transistors to form memory cells would be suitable and the brief process suggested here in only by way of illustration and is not meant to limit the invention to this particular process. For example, the permanent field oxide regions 52 would be formed and source/drain regions 54 for the metal oxide semiconductor field effect transistor (MOSFET) 56 could be implanted through a pad oxide. The trench 58 may then be formed or etched into the side of the active region that is to contain MOSFET 56 and capacitor 50, possibly adjacent to field oxide 52. Next, a dielectric layer 60 may be formed conformal to the surface of the trench 58; wherein the dielectric layer 60 may also form the gate dielectric of the MOSFET 56.

Alternatively, it is conceivable that the trench 58 and dielectric layer 60 could be formed prior to formation of the source/drain regions 54 and that the dielectric layer 60 of the MOSFET 56 could serve both as a pad for the implantation of the source/drain regions 54 and as the gate dielectric. Still another possibility is that the thin dielectric layer for the trench capacitor 50 and the gate dielectric for the MOSFET 56 are formed in separate steps. One possible material for these dielectric layers is silicon dioxide.

The next step may involve the cutting of the dielectric layer 60 to permit contact to the source/drain regions 54 through holes such as at 62. Both the gate electrode 64 and the combined contact/interior trench capacitor plate 66 may be formed at once, and then subsequently patterned. One suitable material for this conductive material layer is doped polycrystalline silicon, or polysilicon. The polysilicon may be doped during its formation (in situ) or subsequent to its formation, and may be of p+ or p+ type. Of course, the conductive material of the gate electrode 64 and the material of the interior trench capacitor plate 66 may be formed in separate steps and may be made from different materials. The structure illustrated in FIG. 1 includes the n-well 44, although n-well 44 and p-well 46 may be considered optional for the purposes of this invention and not required for the functioning of the inventive capacitor. However, the capacitor 50 does have particular advantage in a complementary metal-oxide-semiconductor (CMOS) circuit where wells of the opposite conductivity type, such as n-wells 44, are present in that the doping of these wells does not have to be increased, since the localized outdiffused region 42 only occurs under the areas where n-channel devices in a p− region are to exist. In other words, note from a comparison of FIG. 1 and FIG. 2 the distance from the p+ source/drain regions to the p+ substrate boundary. The separation of the p+ source/drain region 68 and the p+ substrate 42 remains great enough to provide punchthrough protection, but the localized outgrowth region 42 provides additional capacitance only to the trench capacitors 50 formed in the p− region.

The structure shown in FIG. 1 of the finished capacitor 50 of the instant invention demonstrates that a trench capacitor structure could be fabricated with increased capacitance for the same trench depth, without requiring the surface of the doped semiconductor substrate to be nearer the surface of the doped epitaxial layer thereon, which would require the well doping of the opposite doping type to be undesirably increased to prevent punchthrough.

I claim:

1. A process for forming a trench capacitor, comprising:
   providing a doped semiconductor substrate, relatively heavily doped with an impurity of a first conductivity type;
   providing a doped layer of semiconductor material on the semiconductor substrate, where the doped layer is relatively lightly doped with an impurity of the first conductivity type;
   providing a localized outdiffusion region extending from the doped semiconductor substrate into the doped layer of semiconductor material, where the localized outdiffused region is relatively heavily doped with the same impurity of the doped semiconductor substrate and the source of the impurity is the doped semiconductor substrate;
   providing a trench within the doped layer of semiconductor material extending into the localized outdiffusion region;
   providing a thin layer of dielectric material on the trench; and
   providing a region of conductive material on the layer of dielectric material in the trench.

2. The process of claim 1 wherein the provision of the localized outdiffused region comprises growing an oxide region in an area of the substrate where the trench capacitor is formed, and subsequently removing the oxide region.

3. The process of claim 1 wherein the doped layer of semiconductor material is selected from the group of structures consisting of a well and an epitaxial layer.

4. A process for forming a trench capacitor, comprising:
   providing a doped semiconductor substrate, relatively heavily doped with an impurity of a first conductivity type;
   providing a doped layer of semiconductor material on the semiconductor substrate, where the doped layer is relatively lightly doped with an impurity of the first conductivity type and is selected from the group of structures consisting of a well and an epitaxial layer;
   growing an oxide region in an area of the substrate where the trench capacitor is to be formed and subsequently removing the oxide region to cause a localized outdiffusion region to diffuse from the doped semiconductor substrate into the doped layer of semiconductor material only in the proximity of the oxide region, where the localized outdiffused region is relatively heavily doped;
   providing a trench within the doped layer of semiconductor conductor material extending into the localized outdiffusion region;
   providing a thin layer of dielectric material on the trench; and
   providing a region of conductive material on the layer of dielectric material in the trench.

* * * * *